(12) United States Patent
Nishijima et al.

(10) Patent No.: US 8,253,472 B2
(45) Date of Patent: Aug. 28, 2012

(54) LEVEL SHIFT CIRCUIT WITH NOISE BLOCKING TRANSMISSION CIRCUIT

(75) Inventors: Kenichi Nishijima, Matsumoto (JP); Kouhei Yamada, Matsumoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 49 days.

(21) Appl. No.: 12/805,397

(22) Filed: Jul. 29, 2010

(65) Prior Publication Data

US 2011/0043269 A1 Feb. 24, 2011

(30) Foreign Application Priority Data

Aug. 19, 2009 (JP) ................. 2009-189856

(51) Int. Cl.
*H03L 5/00* (2006.01)
(52) U.S. Cl. ..................................... 327/333
(58) Field of Classification Search .................. 327/333; 326/80
See application file for complete search history.

(56) References Cited

U.S. PATENT DOCUMENTS

2002/0057106 A1* 5/2002 Koo ................... 326/80

FOREIGN PATENT DOCUMENTS

| JP | H04-230117 | 8/1992 |
| JP | H09-200017 | 7/1997 |
| JP | 2000-252809 | 9/2000 |

* cited by examiner

*Primary Examiner* — John Poos
(74) *Attorney, Agent, or Firm* — Manabu Kanesaka

(57) ABSTRACT

In a level shift circuit in a high electric potential side driving circuit, a latch circuit and a transmission circuit located at the front stage of the latch circuit are provided. The transmission circuit makes its output impedance high when two inputs V1 and V2 are detected as low level signals by which erroneous signals due to dv/dt noises can be effectively blocked. In the transmission circuit, since there is no necessity of deliberately increasing delay in part of the circuit for achieving complete blocking, error signals due to dv/dt noises can be blocked with the minimum delay time.

6 Claims, 9 Drawing Sheets

LEVEL SHIFT CIRCUIT WITH NOISE BLOCKING TRANSMISSION CIRCUIT

BACKGROUND OF THE INVENTION AND RELATED ART STATEMENT

The present invention relates to a level shift circuit that transmits a signal to a secondary system operated at an operating electric potential different from the operating electric potential on a primary side as an input side.

In a circuit such as a half-bridge circuit having switching devices connected in series and driven by a power supply in a high electric potential system, a level shift circuit is used for driving a switching device on the high electric potential system side by a signal on a low electric potential system side.

FIG. 4 is a circuit diagram showing an example of a configuration of a half-bridge circuit using a conventional level shift circuit. In FIG. 4, reference numeral 100 denotes an output circuit with a low electric potential side switching device SWL and a high electric potential side switching device SWH connected in series. The output circuit 100 is supplied with a voltage from a high voltage power supply Ein. The low electric potential side switching device SWL is a device such as an N-channel MOS transistor or an N-type IGBT (Insulated Gate Bipolar Transistor), and the high electric potential side switching device SWH is a device such as an N-channel or P-channel MOS transistor or a P-type or N-channel IGBT Reference numeral 110 denotes a high electric potential side driving circuit formed of a level shift circuit, a driving device DRVH, carrying out on-off control of the high electric potential side switching device SWH by receiving the output of the level shift circuit, and a power supply E1. The level shift circuit is a section of the high electric potential side driving circuit 110 except the driving device DRVH and the power supply E1. Namely, the level shift circuit is formed of a series circuit of a resistor R1 and an N-channel MOS transistor MN1, a series circuit of a resistor R2 and an N-channel MOS transistor MN2, a flip-flop FF as a storage device, an inverter (inverting device) INV1 whose input side is connected to the connection point of the resistor R1 and the N-channel MOS transistor MN1 and whose output side is connected to a set input terminal S of the flip-flop FF, and an inverter INV2 whose input side is connected to the connection point of the resistor R2 and the N-channel MOS transistor MN2 and whose output side is connected to a reset input terminal R of the flip-flop FF.

A signal $S_H$ outputted from an output terminal Q of the flip-flop FF is inputted to the driving device DRVH as a signal subjected to level shifting by the level shift circuit. The output side of the driving device DRVH is connected to the gate terminal of the switching device SWH. The low electric potential side power supply terminals of the flip-flop FF, driving device DRVH and power supply E1 are connected to a connection point Vsw (hereinafter the electric potential of the connection point Vsw is also designated by Vsw) of the switching devices SWL and SWH, by which the flip-flop FF and the driving device DRVH receive supplies of power from the power supply E1. Moreover, an end of each of the series circuit of the resistor R1 and the N-channel MOS transistor MN1 and the series circuit of the resistor R2 and the N-channel MOS transistor MN2 is connected to a high electric potential side terminal of the power supply E1 and the other end of each thereof is connected to the ground potential (GND). To the gates of the N-channel MOS transistor MN1 and MN2, input signals $P_{ON}$ and $P_{OFF}$ as pulse signals are inputted, respectively, each of which is an input signal to the level shift circuit of the high electric potential side driving circuit 110.

Reference numeral 120 denotes a low electric potential side driving circuit formed of a driving device DRVL carrying out on-off control of the low electric potential side switching device SWL and a power supply E2. The driving device DRVL receives a supply of power from the power supply E2 to output a signal, to which a signal $S_L$ inputted to the driving device DRVL is amplified, to the gate terminal of the low electric potential side switching device SWL. With the circuit configuration, when the signal $S_L$ is a high level signal H (High), the low electric potential side switching device SWL is turned-on (conduction) and, when the signal $S_L$ is a low level signal L (Low), the low electric potential side switching device SWL is turned-off (interruption). In short, the signal $S_L$ is a signal directly instructing the turning-on and -off of the low electric potential side switching device SWL.

The input signals $P_{ON}$ and $P_{OFF}$ inputted to the high electric potential side driving circuit 110, different from the signal $S_L$, are such signals that the input signal $P_{ON}$ is a signal instructing the timing of the initiation of the turned-on period (termination of the turned-off period) of the high electric potential side switching device SWH and the input signal $P_{OFF}$ is a signal instructing the timing of the initiation of the turned-off period (termination of the turned-on period) of the high electric potential side switching device SWH. FIG. 5 is a timing chart for illustrating a level shift operation in the half-bridge circuit shown in FIG. 4. The input signal $P_{ON}$ becoming the high level signal H turns-on the N-channel MOS transistor MN1 to make the input signal of the inverter INV1 become a low level signal L and make the output signal become a high level signal H. This sets the flip-flop FF to provide the signal $S_H$ as the high level signal H, which makes the high electric potential side switching device SWH turned-on. Moreover, the input signal $P_{OFF}$ becoming the high level signal H makes the N-channel MOS transistor MN2 turned-on to make the input signal of the inverter INV2 become a low level signal L and make the output signal become a high level signal H. This resets the flip-flop FF to provide the signal $S_H$ as the low level signal L, which makes the high electric potential side switching device SWH turned-off.

The switching devices SWL and SWH are complementary turned-on and -off (when the one is turned-on, the other is turned-off) except for their respective dead times in which both of them are turned-off. When the switching device SWL is turned-on, the electric potential Vsw at the connection point Vsw becomes the ground potential and, when the switching device SWH is turned-on, the electric potential Vsw at the connection point Vsw becomes equal to the output voltage Ein of the high voltage power supply Ein (the output voltage is also denoted by Ein).

A sign RL denotes a load that receives a supply of power from the half-bridge circuit. The load RL is connected between the connection point Vsw and the ground.

Here, consider the case when a state in which the switching device SWL is turned-on is switched to a state in which the switching device SWH is turned-on. At this time, the electric potential Vsw of the connection point Vsw is abruptly changed from the ground potential to an electric potential equal to the high voltage Ein. In an actual half-bridge circuit, between the connection point Vsw and the connection point of the resistor R1 and the N-channel MOS transistor MN1, a parasitic capacitance Cp11 is present, and between the connection point Vsw and the connection point of the resistor R2 and the N-channel MOS transistor MN2, a parasitic capacitance Cp21 is present. Moreover, between the connection point of the resistor R1 and the N-channel MOS transistor MN1 and the ground, a parasitic capacitance Cp12 is present and, between the connection point of the resistor R2 and the N-channel MOS transistor MN2 and the ground, parasitic capacitance Cp22 is also present.

With both of the N-channel MOS transistors MN1 and MN2 turned-off without the input signal $P_{ON}$ and the input signal $P_{OFF}$ being inputted, the change in the electric potential Vsw at the connection point Vsw from the ground potential to a high electric potential equal to the high voltage Ein causes a voltage to which a voltage equal to the electric potential change is divided by the impedances of the parasitic capacitances Cp11 and Cp12, to be applied to the connection point of the resistor R1 and the N-channel MOS transistor MN1 and causes a voltage to which a voltage equal to the electric potential change is divided by the impedances of the parasitic capacitances Cp21 and Cp22, to be applied to the connection point of the resistor R2 and the N-channel MOS transistor MN2. This produces an electric potential difference across each of the resistors R1 and R2. Namely, a false signal of a low level signal L is inputted to each of the inverters INV1 and INV2, which causes the simultaneous input of the set input signal and a reset input signal into the flip-flop FF. As a result, a problem occurs in that the output of the flip-flop FF becomes indeterminate, which may also cause the turning-on and -off of the switching device SWH to become indeterminate.

The phenomenon with a set input signal and a reset input signal simultaneously inputted to the flip-flop FF is called a dv/dt noise. The reason is as follows. Namely, with both of the N-channel MOS transistors MN1 and MN2 being turned-off, a change in the electric potential Vsw at the connection point Vsw to a higher electric potential causes both of the voltage across the parasitic capacitance Cp12 and the voltage across the parasitic capacitance Cp22 to increase by which electric charges in the parasitic capacitances Cp12 and Cp22 change to increase. The amounts of the increased electric charges in the parasitic capacitances Cp12 and Cp22 can be considered to be (partly) supplied by currents in the resistors R1 and R2, respectively. The values of the currents in the resistors R1 and R2 are equivalent to the amounts of changes with respect to the time in the electric charges in the parasitic capacitances Cp12 and Cp22, respectively, and the amount of change in electric charges with respect to time is to be proportional to dv/dt, the value of the derivative of the voltage across the capacitor with respect to time. Namely, this is because the phenomenon appears with the currents, whose values are proportional to the values of the derivative with respect to time dv/dt of the electric potential Vsw at the connection point Vsw, simultaneously flowing in the resistors R1 and R2. The phenomenon is, as shown in the later half (the right half) of an elapsed time in FIG. 5, equivalent to that in which the input signals $P_{ON}$ and $P_{OFF}$ simultaneously become high level signals H (in actual, none of the input signals become high level signals H). States of signals with respect to the half-bridge circuit using the conventional level shift circuit are shown in Table 1.

TABLE 1

| | | | | FF |
| --- | --- | --- | --- | --- |
| $P_{ON}$ | $P_{OFF}$ | S Input | R Input | $S_H$ |
| L | L | L | L | Previous State |
| H | L | H | L | H |
| L | H | L | H | L |
| H | H | H | H | Indeterminate |

The dv/dt noise has a possibility of directly relating to the big problem of causing the turning-on and -off of the switching device to be indeterminate. Thus, it is necessary to take measures against this.

In FIG. 6, the configuration of the power device driving circuit disclosed in Japanese Patent No. 3,429,937 is shown as a conventional art with respect to a measure against dv/dt noises. In FIG. 6, the same parts as those shown in FIG. 4 are denoted with the same reference numerals and signs with detailed explanations thereof omitted. The parasitic capacitances Cp11, Cp12, Cp21 and Cp22 are omitted to be shown in the drawing (the same in the following). The circuit shown in FIG. 6 differs from the circuit shown in FIG. 4 in that a protection circuit 200 is provided in a level shift circuit in a high electric potential side driving circuit 110A. When any one of the signals outputted from the two inverters INV1 and INV2 is inputted to the protection circuit 200 as a low level signal L, the protection circuit 200 transmits the output signals of the inverters INV1 and INV2 to the set terminal S and the reset terminals R, respectively, of the flip-flop FF as they are. Moreover, when both of the output signals of the inverters INV1 and INV2 are high level signals H, the protection circuit 200 outputs low level signals L to both of the set terminal S and the reset terminals R of the flip-flop FF to make the flip-flop FF keep the previous state so as to prevent the output of the flip-flop FF from becoming indeterminate. Thus, as shown in FIG. 7, a timing chart for illustrating the operation of the conventional power device driving circuit shown in FIG. 6, even when dv/dt noises are produced to cause a state equivalent to the state in which both of input signals $P_{ON}$ and $P_{OFF}$ become high level signals H, the protection circuit 200 makes the output of the flip-flop FF unchanged to keep the previous state, thereby preventing the output of the flip-flop FF from becoming indeterminate.

In FIGS. 8 and 9, two examples of circuit configurations are shown with respect to the conventional protection circuit 200. FIG. 8 is a circuit diagram showing a first example of the circuit configuration, in which inverters INV10 to INV16, a NOR gate NOR10, and NAND gates NAND10 and NAND 11 are provided. To the inverters INV10 and INV11, the outputs of the inverters INV1 and INV2 are inputted, respectively. The output sides of the INV15 and INV16 are connected to the set input terminal S and the reset input terminal R, respectively, of the flip-flop FF. In the circuit, with both of the output signals of the inverters INV1 and INV2 being high level signals H, the output signal of the NOR gate NOR10 becomes a high level signal H, and the output signal of the inverter INV 13 becomes a low level signal L. The outputted low level signal L is inputted to the NAND gates NAND10 and NAND 11, both of which therefore output high level signals H, to make both of the output signals of the inverters INV15 and INV16 become low level signals L, which are inputted to the set input terminal S and the reset input terminal R. On the other hand, when either one of the input signal $P_{ON}$ or $P_{OFF}$ becomes a low level signal L, the output of one of the inverters INV1 and INV2 becomes a low level signal L to make the output of the NOR gate NOR10 provide a low level signal L, by which the output of the inverter INV13 becomes a high level signal H. Thus, the outputs of the inverters INV15 and INV16 become equal to the outputs of the inverters INV1 and INV2, respectively.

FIG. 9 is a circuit diagram showing a second example of the circuit configuration of the conventional protection circuit 200, which has inverters INV20 to INV22, NOR gates NOR20 and NOR21, and a NAND gate NAND20. The output of the inverter INV1 is inputted to the inverter INV20 and one of input terminals of the NAND gate NAND20, and the output of the inverter INV2 is inputted to the inverter INV 22 and the other input terminal of the NAND gate NAND20. The output sides of the NOR gates NOR20 and NOR 21 are connected to the set input terminal S and the reset input terminal R, respectively, of the flip-flop FF. In the circuit, with both of the outputs of the inverters INV1 and INV2 being high level signals H, the output of the NAND gate NAND20 becomes a low level signal L and the output of the inverter INV21 therefore becomes a high level signal H, which is inputted to the NOR gates NOR20 and NOR21. Therefore, both of the outputs of the NOR gates NOR20 and NOR21 to be inputted to the set input terminal S and the reset input terminal R, respectively, become low level signals L. On the other hand, with either one of the output of the inverter INV1 or INV2 being a low level signal L, the output of the NAND circuit NAND20 becomes a high level signal H to make the output of the inverter INV21 become a low level signal L. Thus, the outputs of the NOR gates NOR20 and NOR21 become equal to the outputs of the inverters INV1 and INV2, respectively. In addition, states of signals with respect to the power device driving circuit disclosed in Japanese Patent No. 3,429,937 shown in FIG. 6 are shown in Table 2.

TABLE 2

| | | FF | | |
|---|---|---|---|---|
| $P_{ON}$ | $P_{OFF}$ | S Input | R Input | $S_H$ |
| L | L | L | L | Previous State |
| H | L | H | L | H |
| L | H | L | H | L |
| H | H | L | L | Previous State |

Patent Document 1: Japanese Patent No. 3,429,937

In the protection circuit 200, before the outputs of the inverters INV1 and INV2 are transmitted to the set input terminal S and the reset input terminal R, respectively, of the flip-flop FF through the protection circuit 200, it is necessary to detect that both of the outputs of the inverters INV1 and INV2 are high level signals H and to block them. Otherwise, the high level signals H of the outputs of the inverters INV1 and INV2 would pass through the protection circuit 200 to be transmitted to the flip-flop FF. Accordingly, in the circuit shown in FIG. 8, before the inverters INV12 and INV14 responds to the outputs of the inverters INV1 and INV2, respectively, the inverter INV13 must respond to the outputs. In the circuit shown in FIG. 9, before the inverters INV20 and INV22 responds to the outputs of the inverters INV1 and INV2, respectively, the inverter INV21 must respond to the outputs. In the circuit shown in FIG. 8, there is a difference in the number of gate stages, through which a signal (an output signal of the inverter INV1 or the inverter INV 2) passes, between a signal path through the inverter INV12 (or the inverter INV14) and a signal path through the NOR gate NOR10 and the inverter INV13. In the circuit shown in FIG. 9, there is a difference in the number of gate stages, through which a signal (an output signal of the inverter INV1 or the inverter INV 2) passes, between a signal path through the inverter INV20 (or the inverter INV22) and a signal path through the NAND gate 20 and the inverter INV21. Thus, for ensuring the foregoing, delay times of the inverters INV12, INV14, INV20 and INV22 must be deliberately lengthened (for example, in the circuit shown in FIG. 8, the independent delay time of each of the inverter INV12 and the inverter INV14 must be made longer than the sum of the delay times of both of the NOR gate NOR10 and the inverter INV13).

On the other hand, when a half-bridge circuit is applied to a circuit such as a switching power supply circuit, because of the recent progress in the switching speed, high-speed switching requires more precise control of the time of turning-on and -off of a switching device in one period. Thus, lengthening the delay time of the inverters INV12, INV1, INV20 and INV22 is against the progress, which makes the high-speed switching difficult.

Accordingly, the object of the invention is to solve the foregoing problem and provide a level shift circuit which can take a measure against dv/dt noises without causing unnecessary delay in turning-on and -off control of a switching device.

Further objects and advantages of the invention will be apparent from the following description of the invention.

SUMMARY OF THE INVENTION

For solving the above problems and achieving the above object, a first aspect of the invention is a level shift circuit transmitting input signals from a primary electric potential system to a system operating in a secondary electric potential system at an electric potential different from that of the primary electric potential system, the level shift circuit including: a first series circuit comprising a first resistor and a first switching device connected in series between a high electric potential side of a power supply in the secondary electric potential system and a low electric potential side of a power supply in the primary electric potential system; a second series circuit comprising a second resistor and a second switching device connected in series between the high electric potential side of the power supply in the secondary electric potential system and the low electric potential side of the power supply in the primary electric potential system; a transmission circuit operated in the secondary electric potential system, the connection point of the first resistor and the first switching device in the first series circuit and the connection point of the second resistor and the second switching device in the second series circuit being respectively connected to input terminals of the transmission circuit; and a storage device operated in the secondary electric potential system to which device the output of the transmission circuit is inputted. To the first and second switching devices, the input signals from the primary electric potential system are inputted for controlling turning-on and -off of the first and second switching devices, respectively, and the output impedance of the transmission circuit is made to be high when the electric potential at the connection point of the first resistor and the first switching device in the first series circuit and the electric potential at the connection point of the second resistor and the second switching device in the second series circuit are brought into states equivalent to states when the first and second switching devices are simultaneously turned-on.

A second aspect of the invention is that, in the level shift circuit according to the first aspect, the transmission circuit includes: an inverting device; a P-channel MOS transistor series circuit with a first and second P-channel MOS transistors connected in series; and an N-channel MOS transistor series circuit with first and second N-channel MOS transistors connected in series. The P-channel MOS transistor series circuit and the N-channel MOS transistor series circuit are connected in series between the high electric potential side and a low electric potential side of the power supply in the secondary electric potential system; the connection point of the first resistor and the first switching device in the first series circuit is connected to the gate of the first P-channel MOS transistor and the gate of the first N-channel MOS transistor;

the connection point of the second resistor and the second switching device in the second series circuit is connected to the input terminal of the inverting device; the output terminal of the inverting device is connected to the gate of the second P-channel MOS transistor and the gate of the second N-channel MOS transistor; and the connection point of the P-channel MOS transistor series circuit and the N-channel MOS transistor series circuit is connected to the data input terminal of the storage device.

A third aspect of the invention is that, in the level shift circuit according to the second aspect, the storage device is formed of a buffer circuit with a resistor connected between the input side and the output side thereof.

A fourth aspect of the invention is that, in the level shift circuit according to the third aspect, the buffer circuit is formed of two inverting devices connected in series.

A fifth aspect of the invention is that, in the level shift circuit according to the first aspect, the transmission circuit has first and second inverting devices each having an enable terminal, the storage device has a set terminal to which a third resistor is connected with one end thereof and a reset terminal to which a fourth resistor is connected with one end thereof, the third resistor is further connected to the low electric potential side of the power supply in the secondary electric potential system with the other end thereof, the fourth resistor is further connected to the low electric potential side of the power supply in the secondary electric potential system with the other end thereof, the connection point of the first resistor and the first switching device in the first series circuit is connected to the input terminal of the first inverting device and the enable terminal of the second inverting device, the connection point of the second resistor and the second switching device in the second series circuit is connected to the input terminal of the second inverting device and the enable terminal of the first inverting device, the output terminal of the first inverting device is connected to the set terminal of the storage device, and the output terminal of the second inverting device is connected to the reset terminal of the storage device.

A sixth aspect of the invention is that, in the level shift circuit according to any one of the first to fifth aspects, when the electric potential of the input signal transmitted from the primary electric potential system to a system operated in the secondary electric potential system is changed from a low level to a high level, the first switching device is turned-on only in a very short time and, when the electric potential of the input signal is changed from the high level to the low level, the second switching device is turned-on only in a very short time.

In the level shift circuit according to the invention, at the front stage of the latch circuit as the storage device, the transmission circuit is provided which makes its output impedance high when detecting that both of the input signals $P_{ON}$ and $P_{OFF}$ are high level signals H or detecting a state equivalent to this. Thus, erroneous signals due to dv/dt noises can be effectively blocked. Namely, since the transmission circuit that makes its output impedance high can be formed without deliberately increasing delay time in part of the circuit, error signals due to dv/dt noises can be blocked with the minimum delay time.

DESCRIPTION OF THE PREFERRED EMBODIMENT

In the following, explanations will be made about the level shift circuit according to the invention with the use of the attached drawings.

First Example

Figure 1:
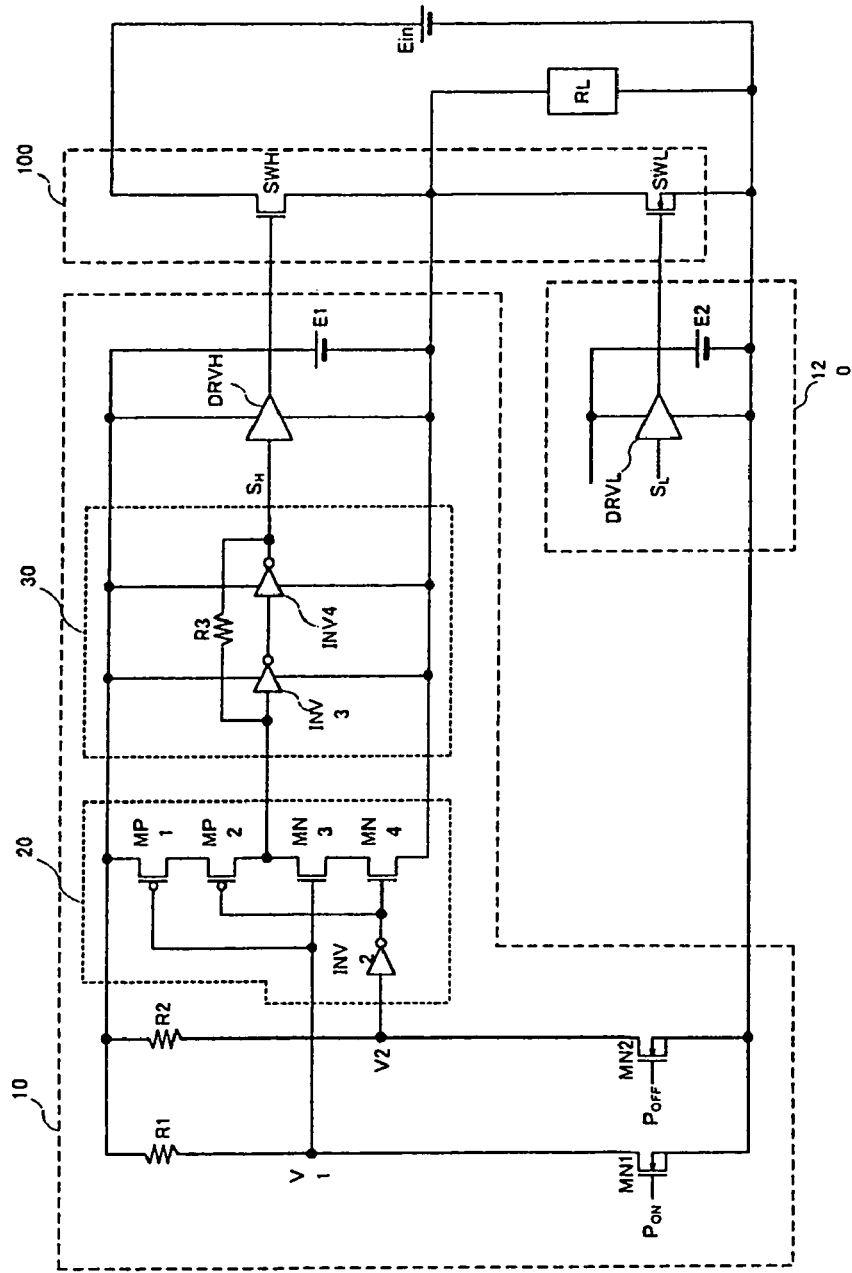
FIG. 1 is a circuit diagram showing a configuration of a half-bridge circuit using a first example of an embodiment of the level shift circuit according to the invention.

FIG. 1 is a circuit diagram showing a configuration of a half-bridge circuit using a first example of an embodiment of the level shift circuit according to the invention. In FIG. 1, parts common to those shown in FIG. 6 are denoted with the same reference numerals and signs with detailed explanations thereof omitted.

Figure 6:
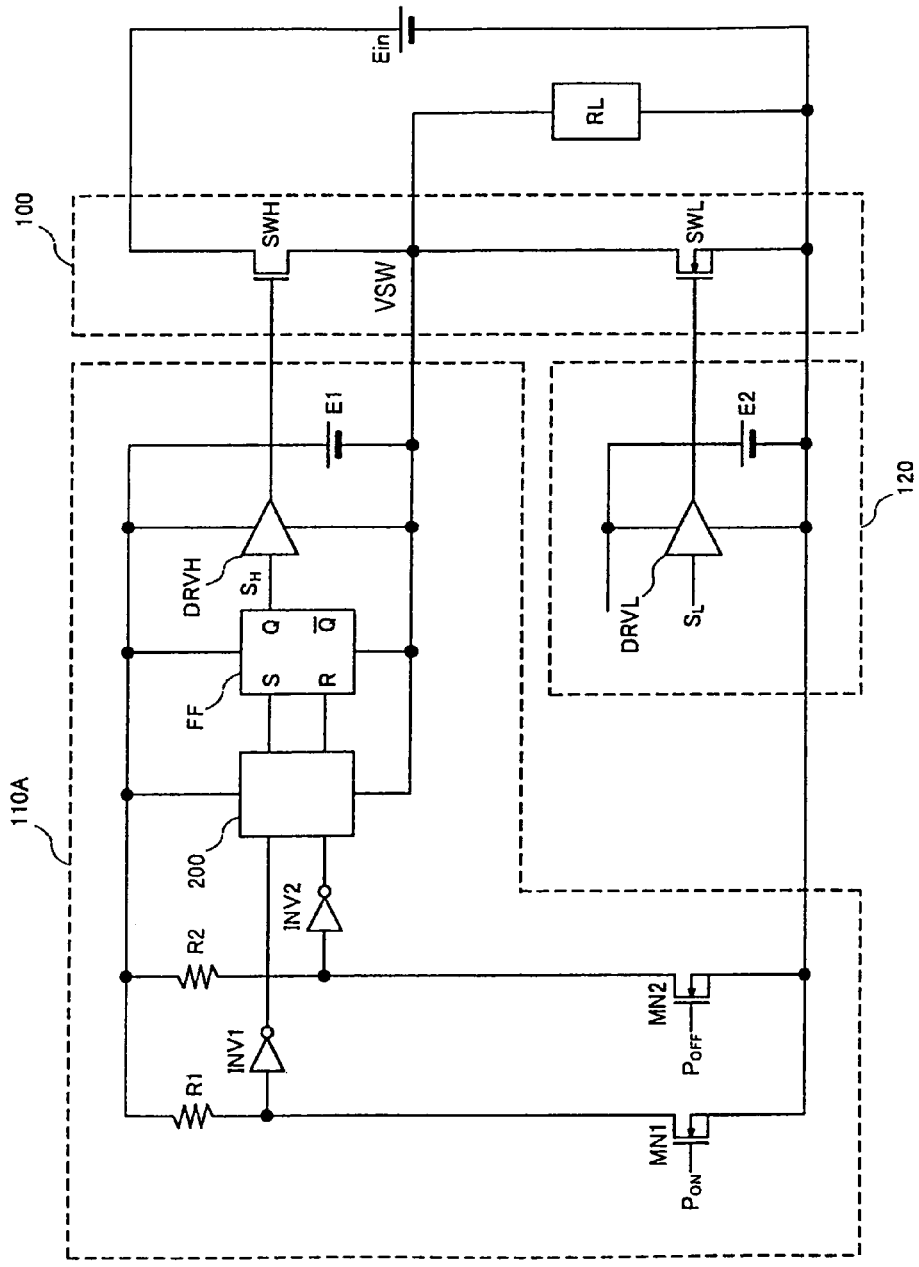
FIG. 6 is a circuit diagram illustrating the configuration of the power device driving circuit disclosed in Japanese Patent No. 3,429,937 as a conventional art with respect to a measure against dv/dt noises.
Figure 7:
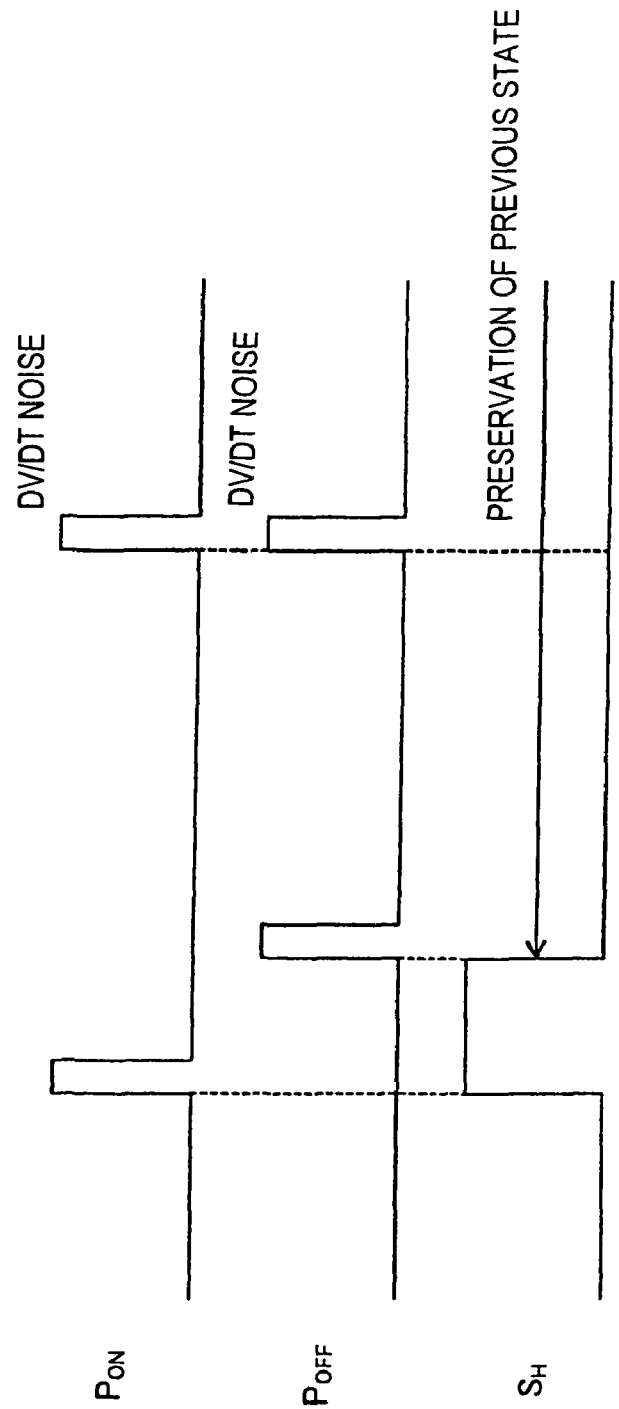
FIG. 7 is a timing chart for illustrating the operation of the conventional power device driving circuit shown in FIG. 6.
Figure 8:
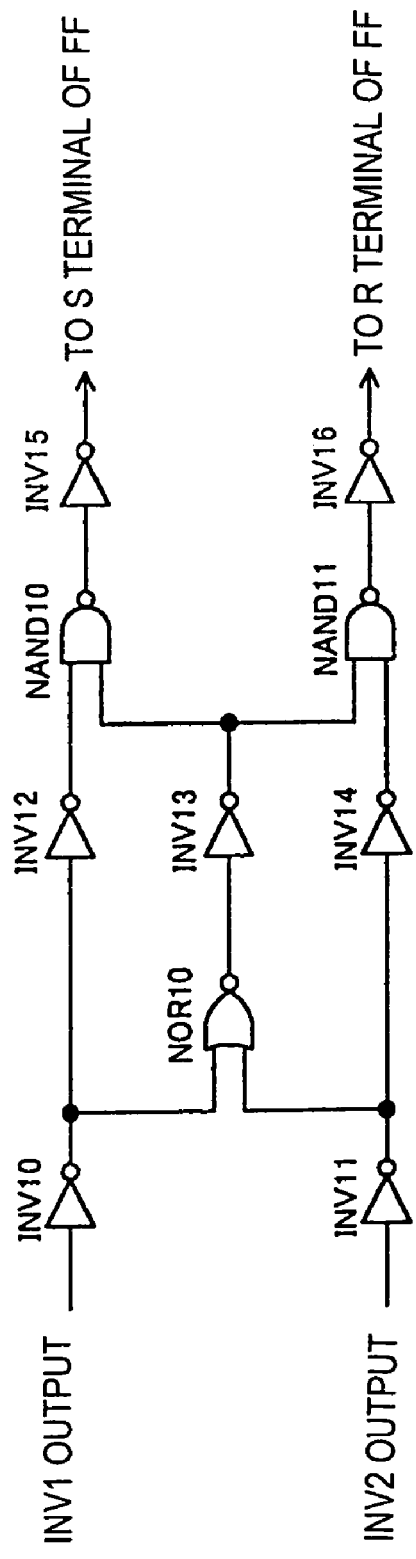
FIG. 8 is a circuit diagram showing a first example of the circuit configuration of the conventional protection circuit 200.
Figure 9:
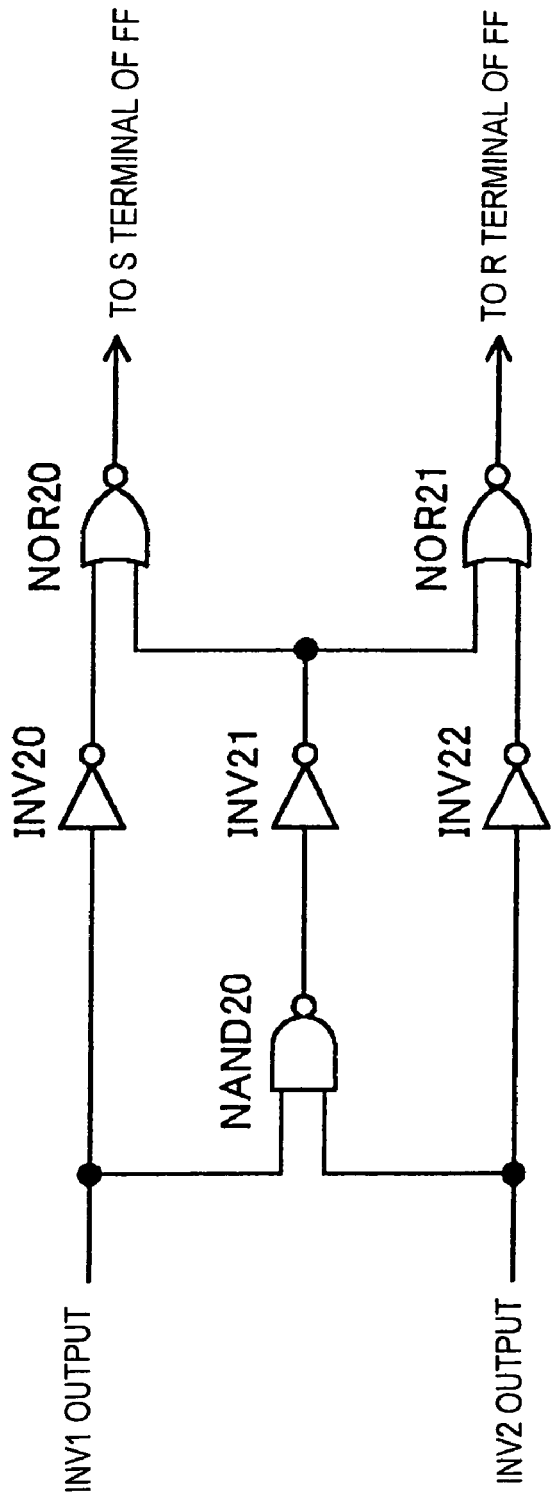
FIG. 9 is a circuit diagram showing a second example of the circuit configuration of the conventional protection circuit 200.

The main difference between the half-bridge circuit shown in FIG. 1 and the half-bridge circuit shown in FIG. 6 is that the half-bridge circuit shown in FIG. 1 is provided with a transmission circuit 20 rather than the protection circuit 200 in a level shift circuit in a high electric potential side driving circuit 10, and as a storage device, the flip-flop FF having the set input terminal S and the reset input terminal R is replaced by the latch circuit 30.

The transmission circuit 20 is formed of a series circuit of P-channel MOS transistors MP1 and MP2, N-channel MOS transistors MN3 and MN4 having supplies of power from a power supply E1, and an inverter INV2. The output terminal of the inverter INV2 is connected to the gates of the P-channel MOS transistor MP2 and the N-channel MOS transistors MN4. The input terminal of the inverter INV2 is connected to a connection point of a resistor R2 and an N-channel MOS transistor MN2 (let the electric potential at the connection point be V2). Moreover, a connection point of a resistor R1 and an N-channel MOS transistor MN1 (let the electric potential at the connection point be V1) is connected to the gates of the P-channel MOS transistor MP1 and the N-channel MOS transistors MN3. The inverter INV2 also has a supply of power from the power supply E1.

The latch circuit 30 is formed of inverters INV3 and INV4, and a resistor R3 connected between the input terminal of the inverter INV3 and the output terminal of the inverter INV4. The latch circuit 30 also has a supply of power from the power supply E1. The input to the inverter INV3 becomes the input to the latch circuit 30 and, along with this, the output from the inverter INV4 becomes the output of the latch circuit 30.

The latch circuit 30 is a circuit, which stores its value and outputs the value when an input signal is a low level signal L or a high level signal H, and keeps the value stored immediately before the output impedance of the transmission circuit 20 becomes high and then outputs the stored value when the output impedance of the transmission circuit 20 that provides the input signal becomes high.

The transmission circuit 20 is a circuit, which makes its output impedance high so as not to influence the latch circuit 30 when dv/dt noises are produced, that is, when both of the electric potentials V1 and V2 become low level. Namely, when both of the levels of the electric potentials V1 and V2 are low, both of the N-channel MOS transistor MN3 and the P-channel MOS transistor MP2 are turned-off to cause the impedance at the connection point of the P-channel MOS transistor MP2 and the N-channel MOS transistor MN3 as an output terminal of the transmission circuit 20 to become high. That is, the output impedance of the transmission circuit 20 becomes high. Thus, the latch circuit 30 connected to the transmission circuit 20 keeps the previous state to be capable of being free from the influence of dv/dt noises. Moreover, when both of input signals $P_{ON}$ and $P_{OFF}$ inputted to the high electric potential side driving circuit 10 are low level signals L, that is, both of the electric potentials V1 and V2 are at high levels, the P-channel MOS transistor MP1 and the N-channel MOS transistor MN4 are turned-off, by which the output impedance of the transmission circuit 20 becomes high to allow the latch circuit 30 to continue to keep the previous state.

States of signals with respect to the transmission circuit 20 and the latch circuit 30 are shown in Table 3. In Table 3, the sign "Hi-Z" means high impedance. As is known from Table 3, in a state with only one of the input signals $P_{ON}$ and $P_{OFF}$ being inputted to the high electric potential side driving circuit 10 (a state with only one of them being a high level signal H), that is, with one of the electric potentials V1 and V2 being at a low level and the other being at a high level, information of the input signals $P_{ON}$ and $P_{OFF}$ is to be transmitted from the transmission circuit 20 to the latch circuit 30. Namely, when only the input signal $P_{ON}$ becomes a high level signal H, the output signal of the transmission circuit 20 (the input signal to the latch circuit 30) becomes a high level signal H, and when only the input signal $P_{OFF}$ becomes a high level H, the output signal of the transmission circuit 20 (the input signal to the latch circuit 30) becomes a low level signal L.

TABLE 3

| $P_{ON}$ | $P_{OFF}$ | V1 | V2 | MP1 | MP2 | MN3 | MN4 | Latch Input | $S_H$ |
|---|---|---|---|---|---|---|---|---|---|
| L | L | H | H | OFF | ON | ON | OFF | Hi-Z | Previous State |
| H | L | L | H | ON | ON | OFF | OFF | H | H |
| L | H | H | L | OFF | OFF | ON | ON | L | L |
| H | H | L | L | ON | OFF | OFF | ON | Hi-Z | Previous State |

In this way, the present embodiment eliminates the influence of the dv/dt noise by increasing the output impedance of the transmission circuit 20 when the dv/dt noise is produced. Moreover, by the series circuit of the same P-channel MOS transistors MP1 and MP2, and the same N-channel transistors MN3 and MN4, the transmission circuit 20 realizes the function of reflecting information of the electric potentials V1 and V2 on its output and the function of detecting a dv/dt noise to make its output impedance high. Thus, there is no necessity of deliberately delaying part of the circuit, so that error signals due to dv/dt noise can be blocked with the minimum delay time.

In Table 3, the state in which both of the input signals $P_{ON}$ and $P_{OFF}$ become high level signals H is for indicating that dv/dt noises are produced for convenience. Thus, actually, no high level signals H are to be externally inputted as the input signals $P_{ON}$ and $P_{OFF}$. In addition, the order of connecting the P-channel MOS transistors MP1 and MP2 and/or the order of connecting the N-channel MOS transistors MN3 and MN4 can be exchanged.

Figure 2:
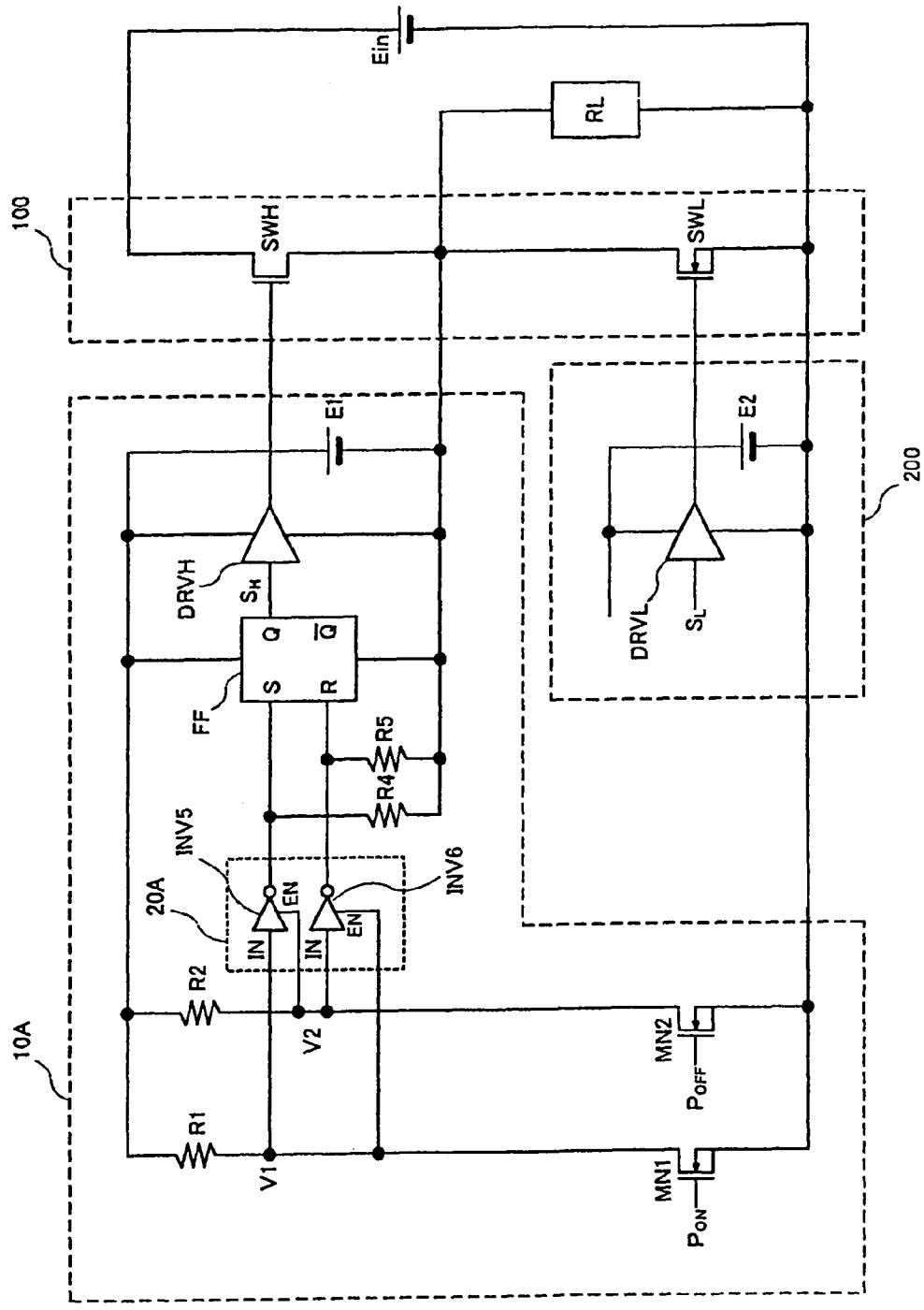
FIG. 2 is a circuit diagram showing a configuration of a half-bridge circuit using a second example of an embodiment of the level shift circuit according to the invention.

FIG. 2 is a circuit diagram showing a configuration of a half-bridge circuit using a second example of the embodiment of the level shift circuit according to the invention. In FIG. 2, parts common to those shown in FIGS. 1 and 6 are denoted with the same reference numerals and signs with detailed explanations thereof omitted.

The difference between the half-bridge circuit shown in FIG. 2 and the half-bridge circuit shown in FIG. 6 is that, in the half-bridge circuit shown in FIG. 2, a high electric potential side driving circuit 10A uses no inverters INV1 and INV2, a transmission circuit 20A is provided as a substitute for the protection circuit 200, and pull-down resistors R4 and R5 are connected to the output sides of the transmission circuit 20A to the set input terminal S and the reset input terminal R of a flip-flop FF, respectively.

Figure 3:
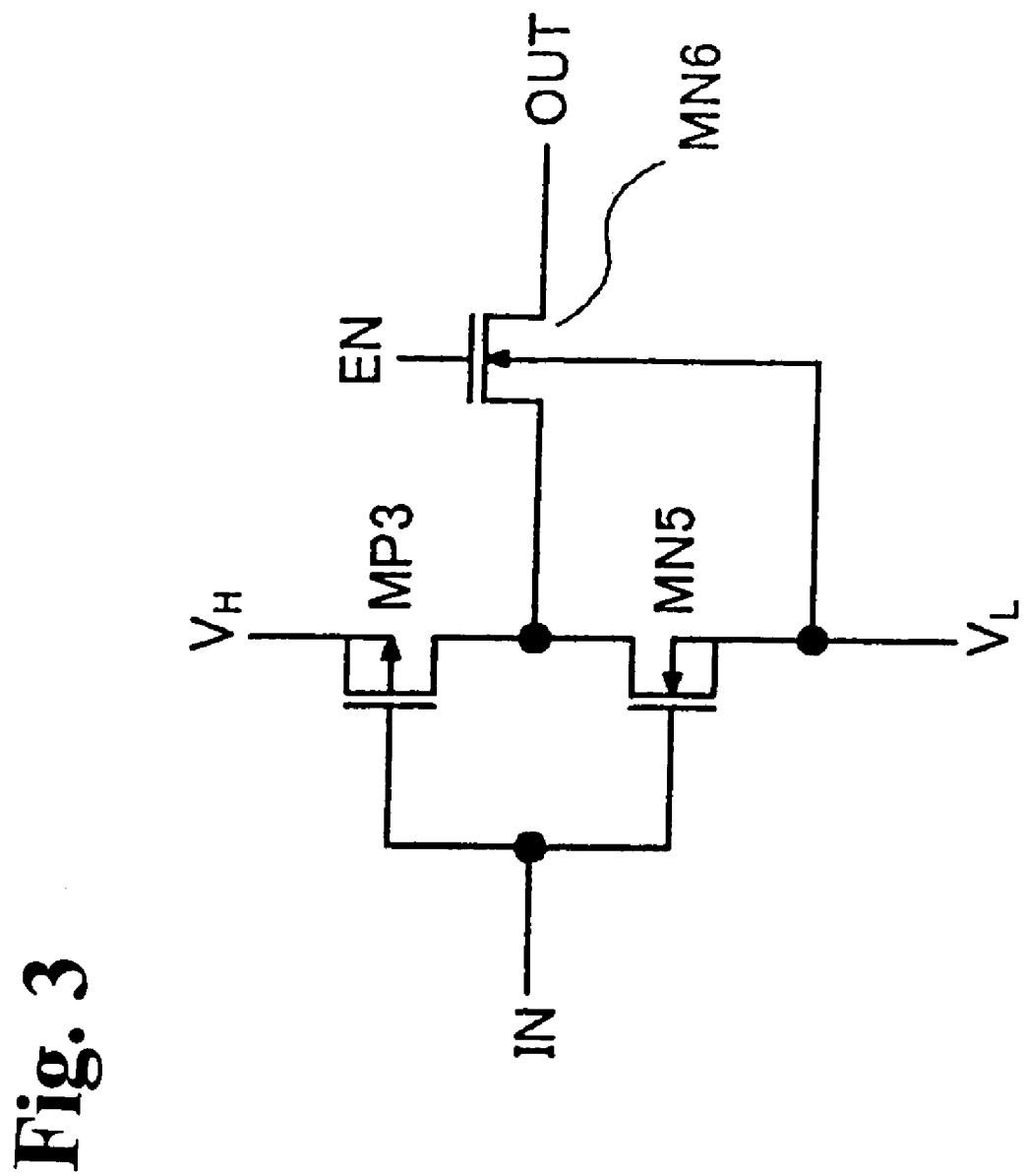
FIG. 3 is a circuit diagram illustrating an example of the configuration of an inverter with an enable terminal.
Figure 4:
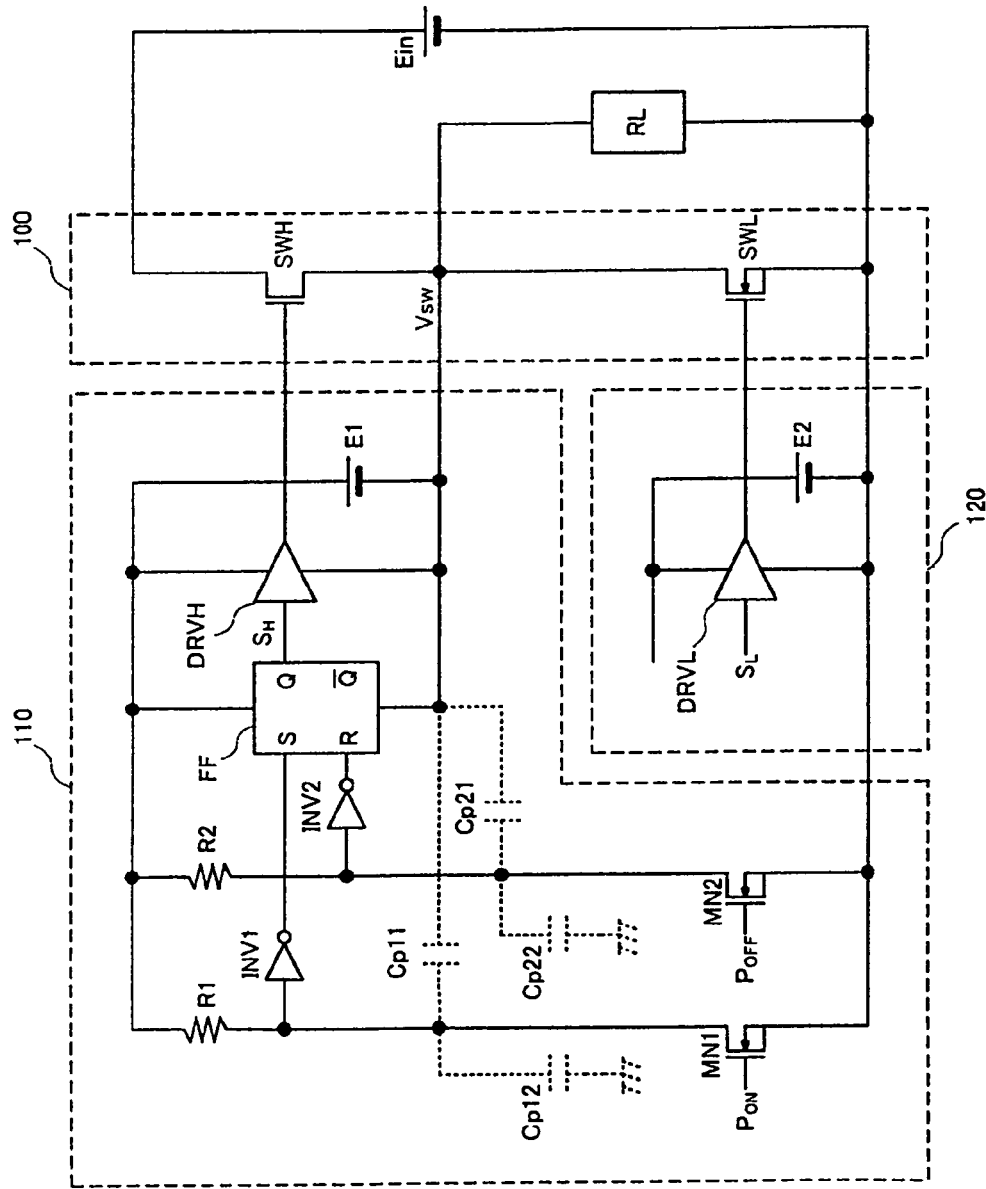
FIG. 4 is a circuit diagram showing an example of a configuration of a half-bridge circuit using a conventional level shift circuit.
Figure 5:
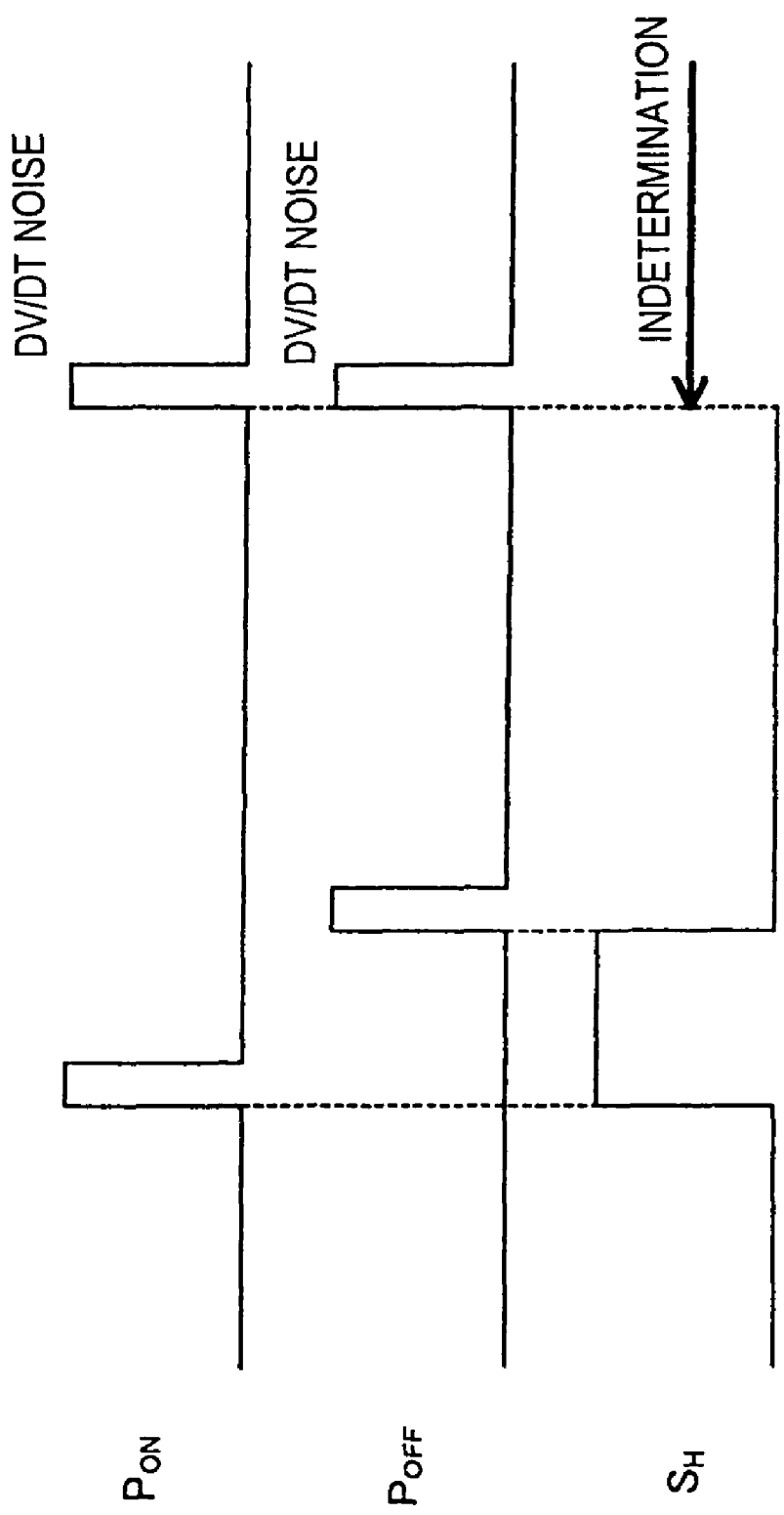
FIG. 5 is a timing chart for illustrating a level shift operation in the half-bridge circuit shown in FIG. 4.

The transmission circuit 20A is formed of two inverters INV5 and INV6, both being provided with enable terminals EN. An example of the configuration of the inverter with enable terminal is shown in FIG. 3. In FIG. 3, the inverter with an enable terminal EN is formed of a P-channel MOS transistor MP3 and N-channel MOS transistors MN5 and MN6. When an input signal to the enable terminal EN is a low level signal L, the N-channel MOS transistor MN6 is turned-off. This makes the output impedance become high at the output terminal OUT of the inverter with the enable terminal EN. On the other hand, when an input signal to the enable terminal EN is a high level signal H, the N-channel MOS transistor MN6 is turned-on. This makes an input signal to an input terminal IN inverted by a normal inverter formed of the P-channel MOS transistor MP3 and the N-channel MOS transistor MN5, and transmitted to the output terminal OUT.

To the inverter INV5 forming the transmission circuit 20A, a voltage corresponding to the electric potential V1 is inputted to the input terminal IN and, along with this, a voltage corresponding to the electric potential V2 is inputted to the enable terminal EN. On the other hand, to the inverter INV6, a voltage corresponding to the electric potential V2 is inputted to the input terminal IN and, along with this, a voltage corresponding to the electric potential V1 is inputted to the enable terminal EN. That is, two inverters INV5 and INV6 are coupled in a relation so that the input voltage (corresponding to the electric potential V1 or V2) to the input terminal IN for one provides the input voltage for the enable terminal EN of the other.

The output side of the inverter INV5 is connected to the set input terminal S of the flip-flop FF as one of outputs of the transmission circuit 20A and, along with this, is pulled-down by a resistor R4. Moreover, the output side of the inverter INV6 is connected to the reset input terminal R of the flip-flop FF as the other output of the transmission circuit 20A and, along with this, is pulled-down by a resistor R5. The resistors R4 and R5 are those for fixing input signals to the flip-flop FF to low level signals L so as not to vary the state of the flip-flop FF when the output impedances of the transmission circuit 20A become high.

States of signals with respect to the transmission circuit 20A and the flip-flop FF are shown in Table 4. In Table 4, the sign "Enable" means that the output impedance of each of the inverters INV5 and INV6 is not high but is in a state of outputting an input signal to the input terminal IN with the input signal made inverted. Moreover, like in Table 3, the state in which both of the input signals $P_{ON}$ and $P_{OFF}$ become high level signals H is for indicating for convenience that dv/dt noises are produced, and actually no high level signals H are externally inputted as the input signals $P_{ON}$ and $P_{OFF}$.

TABLE 4

| | | | | INV5 | | INV6 | | |
|---|---|---|---|---|---|---|---|---|
| $P_{ON}$ | $P_{OFF}$ | V1 | V2 | State | S Input | State | R Input | $S_H$ |
| L | L | H | H | Enable | L | Enable | L | Previous State |
| H | L | L | H | Enable | H | Hi-Z | L | H |
| L | H | H | L | Hi-Z | L | Enable | H | L |
| H | H | L | L | Hi-Z | L | Hi-Z | L | Previous State |

As is also known from Table 4, the transmission circuit 20A is a circuit which makes output, impedances at its two output terminals become high when dv/dt noise is produced, that is, when both of the electric potentials V1 and V2 become low levels so that the noise does not affect the flip-flop FF. Namely, with both of the electric potentials V1 and V2 at low levels, inputs to the enable terminals EN of the inverters INV5 and INV6 become low levels L. Thus, the output impedances at the output terminals of both of the inverters INV5 and INV6 as the output terminals of the transmission circuit 20A become high. In this case, to the set input terminal S and the reset input terminal R of the flip-flop FF, low level signals L are inputted due to the functions of the pull-down resistors R4 and R5, respectively, to make the flip-flop FF keep a previous state so that it can be free from influences of dv/dt noises.

When one of the input signals $P_{ON}$ and $P_{OFF}$ is a high level signal H and the other is a low level signal L, among the inverters INV5 and INV6, an inverter transmitting the inputted high level signal H is brought into an enable state to input the high level signal H to the flip-flop FF, and the output impedance of the other inverter transmitting the inputted low level signal L becomes high. The output side of the inverter, which became a high output impedance, is fixed by the pull-down resistor to a low level, and a low level signal L is inputted to the flip-flop FF.

When both of the input signals $P_{ON}$ and input signal $P_{OFF}$ are low level signals L, both inverters INV5 and INV6 are brought into enable states to input the low level signals L to the set input terminal S and the reset input terminal R of the flip-flop FF.

As explained in the foregoing, in the present embodiment, upon generation of dv/dt noises, the output impedances of the transmission circuit 20A are made high and low level signals L are inputted to the flip-flop FF with the use of the pull-down resistors to thereby eliminate the influences of the dv/dt noises. In other cases, the values of the input signals $P_{ON}$ and $P_{OFF}$ are directly transmitted to the flip-flop FF to change or keep unchanged the state of the flip-flop FF. Moreover, in each of the inverters INV 5 and INV6 with enable terminals EN in the transmission circuit 20A, as shown in FIG. 3, one of voltages corresponding to the electric potentials V1 and V2 is applied to the gates of the P-channel MOS transistor MP3 and the N-channel MOS transistor MN5 forming a normal inverter inverting the input signal to the input terminal IN. On the other hand, the other voltage is applied through the enable terminal EN to the gate of the N-channel MOS transistor MN6 for making the output impedance of the inverter formed of the P-channel MOS transistor MP3 and the N-channel MOS transistor MN5 high. That is, the voltages corresponding to the electric potentials V1 and V2 are simultaneously applied to the three gates of their respective P-channel MOS transistor MP3 and the N-channel MOS transistors MN5 and MN6. Thus, there is no necessity of deliberately delaying part of the circuit, so that error signals due to dv/dt noises can be blocked with the minimum delay time.

In addition, when the flip-flop FF is a flip-flop of a type being set or reset with an input signal of a low level signal L, the resistors R4 and R5 can be provided as pull-up resistors.

The disclosure of Japanese Patent Application No. 2009-189856 filed on Aug. 19, 2009 is incorporated as a reference in the application.

While the present invention has been particularly shown and described with reference to the preferred embodiments thereof, it will be understood by those skilled in the art that the foregoing and other changes can be made without departing from the spirit and scope of the present invention.

What is claimed is:

1. A level shift circuit for transmitting an input signal from a primary electric potential system to a system operating in a secondary electric potential system at an electric potential different from that of the primary electric potential system, the level shift circuit comprising:

a first series circuit comprising a first resistor and a first switching device connected in series between a high electric potential side of a power supply in the secondary electric potential system and a low electric potential side of a power supply in the primary electric potential system;

a second series circuit comprising a second resistor and a second switching device connected in series between the high electric potential side of the power supply in the secondary electric potential system and the low electric potential side of the power supply in the primary electric potential system same as those of the first series circuit;

a transmission circuit operated in the secondary electric potential system, and having input terminals to which a connection point of the first resistor and the first switching device in the first series circuit and a connection point of the second resistor and the second switching device in the second series circuit are respectively connected; and a storage device operated in the secondary electric potential system to which an output of the transmission circuit is inputted, wherein the first and second switching devices are inputted with input signals for the primary electric potential system to control turning-on and -off of the first and second switching devices, respectively, and an output impedance of the transmission circuit is made high when the electric potential at the connection point of the first resistor and the first switching device in the first series circuit and the electric potential at the connection point of the second resistor and the second switching device in the second series circuit are brought into a state equivalent to a state when the first and second switching devices are made simultaneously turned-on, wherein the storage device is a latch circuit comprising invertors and a resistor so that when the output impedance of the transmission circuit becomes high, a value immediate before said output impedance is outputted.

2. The level shift circuit as claimed in claim 1, wherein when the electric potential of the input signal transmitted from the primary electric potential system to a system operated in the secondary electric potential system is changed from a low level to a high level, the first switching device is turned-on only for a very short period of time, and when the electric potential of the input signal is changed from the high level to the low level, the second switching device is turned-on only for a very short period of time.

3. A level shift circuit for transmitting an input signal from a primary electric potential system to a system operating in a secondary electric potential system at an electric potential different from that of the primary electric potential system, the level shift circuit comprising:
- a first series circuit comprising a first resistor and a first switching device connected in series between a high electric potential side of a power supply in the secondary electric potential system and a low electric potential side of a power supply in the primary electric potential system;
- a second series circuit comprising a second resistor and a second switching device connected in series between the high electric potential side of the power supply in the secondary electric potential system and the low electric potential side of the power supply in the primary electric potential system;
- a transmission circuit operated in the secondary electric potential system, and having input terminals to which a connection point of the first resistor and the first switching device in the first series circuit and a connection point of the second resistor and the second switching device in the second series circuit are respectively connected; and
- a storage device operated in the secondary electric potential system to which an output of the transmission circuit is inputted,
- wherein the first and second switching devices are inputted with input signals for the primary electric potential system to control turning-on and -off of the first and second switching devices, respectively, and
- an output impedance of the transmission circuit is made high when the electric potential at the connection point of the first resistor and the first switching device in the first series circuit and the electric potential at the connection point of the second resistor and the second switching device in the second series circuit are brought into a state equivalent to a state when the first and second switching devices are made simultaneously turned-on,
- wherein the transmission circuit comprises:
- an inverting device,
- a P-channel MOS transistor series circuit with first and second P-channel MOS transistors connected in series, and
- an N-channel MOS transistor series circuit with first and second N-channel MOS transistors connected in series;
- the P-channel MOS transistor series circuit and the N-channel MOS transistor series circuit are connected in series between the high electric potential side and the low electric potential side of the power supply in the secondary electric potential system;
- the connection point of the first resistor and the first switching device in the first series circuit is connected to a gate of the first P-channel MOS transistor and a gate of the first N-channel MOS transistor;
- the connection point of the second resistor and the second switching device in the second series circuit is connected to an input terminal of the inverting device,
- an output terminal of the inverting device is connected to a gate of the second P-channel MOS transistor and a gate of the second N-channel MOS transistor, and
- a connection point of the P-channel MOS transistor series circuit and the N-channel MOS transistor series circuit is connected to a data input terminal of the storage device.

4. The level shift circuit as claimed in claim 3, wherein the storage device is formed of a buffer circuit with a resistor connected between an input side and an output side thereof.

5. The level shift circuit as claimed in claim 4, wherein the buffer circuit is formed of two inverting devices connected in series.

6. A level shift circuit for transmitting an input signal from a primary electric potential system to a system operating in a secondary electric potential system at an electric potential different from that of the primary electric potential system, the level shift circuit comprising:
- a first series circuit comprising a first resistor and a first switching device connected in series between a high electric potential side of a power supply in the secondary electric potential system and a low electric potential side of a power supply in the primary electric potential system;
- a second series circuit comprising a second resistor and a second switching device connected in series between the high electric potential side of the power supply in the secondary electric potential system and the low electric potential side of the power supply in the primary electric potential system;
- a transmission circuit operated in the secondary electric potential system, and having input terminals to which a connection point of the first resistor and the first switching device in the first series circuit and a connection point of the second resistor and the second switching device in the second series circuit are respectively connected; and
- a storage device operated in the secondary electric potential system to which an output of the transmission circuit is inputted,
- wherein the first and second switching devices are inputted with input signals for the primary electric potential system to control turning-on and -off of the first and second switching devices, respectively, and
- an output impedance of the transmission circuit is made high when the electric potential at the connection point of the first resistor and the first switching device in the first series circuit and the electric potential at the connection point of the second resistor and the second switching device in the second series circuit are brought into a state equivalent to a state when the first and second switching devices are made simultaneously turned-on,
- wherein the transmission circuit has first and second inverting devices each having an enable terminal;
- the storage device has a set terminal to which a third resistor is connected with one end thereof and a reset terminal to which a fourth resistor is connected with one end thereof;
- the third resistor is further connected to the low electric potential side of the power supply in the secondary electric potential system with the other end thereof;
- the fourth resistor is further connected to the low electric potential side of the power supply in the secondary electric potential system with the other end thereof;
- the connection point of the first resistor and the first switching device in the first series circuit is connected to an input terminal of the first inverting device and the enable terminal of the second inverting device;
- the connection point of the second resistor and the second switching device in the second series circuit is connected to an input terminal of the second inverting device and the enable terminal of the first inverting device;
- an output terminal of the first inverting device is connected to a set terminal of the storage device; and
- an output terminal of the second inverting device is connected to a reset terminal of the storage device.

* * * * *